United States Patent [19]
Salters

[11] 3,849,216
[45] Nov. 19, 1974

[54] METHOD OF MANUFACTURING A SEMICONDUCTOR DEVICE AND SEMICONDUCTOR DEVICE MANUFACTURED BY USING THE METHOD

[75] Inventor: Roelof Herman Willem Salters, Emmasingel, Eindhoven, Netherlands

[73] Assignee: U.S. Philips Corporation, New York, N.Y.

[22] Filed: Nov. 7, 1972

[21] Appl. No.: 304,392

[30] Foreign Application Priority Data

Nov. 20, 1971 Netherlands ....................... 7116013

[52] U.S. Cl. ..................... 148/187, 148/1.5, 357/23, 357/42
[51] Int. Cl. ............................................ H01l 7/44
[58] Field of Search ...................... 148/187; 317/235

[56] References Cited

UNITED STATES PATENTS

| | | | |
|---|---|---|---|
| 3,544,399 | 12/1970 | Dill | 148/187 |
| 3,544,858 | 12/1970 | Kooi | 317/235 |
| 3,576,478 | 4/1971 | Watkins et al. | 317/235 |
| 3,616,380 | 10/1971 | Lepselter et al. | 317/235 X |
| 3,673,471 | 6/1972 | Klein et al. | 317/235 R |
| 3,699,646 | 10/1972 | Vadasz | 148/187 X |
| 3,752,711 | 8/1973 | Kooi et al. | 148/33.3 |

*Primary Examiner*—L. Dewayne Rudledge
*Assistant Examiner*—J. M. Davis
*Attorney, Agent, or Firm*—Frank R. Trifari; Jack Oisher

[57] ABSTRACT

A method of manufacturing a semiconductor device, preferably an insulated gate field effect transistor, comprising a surface zone having conductivity properties other than the adjoining semiconductor material beside which a conductive layer is present which is separated from the semiconductor surface by an insulating layer. According to the invention, a contact window is provided on the surface zone in a self-registering manner, an edge portion of said window being determined by an insulating layer which is obtained on the conductive layer by a superficial chemical conversion which does not attack the semiconductor body, for example, as a result of a masking layer present thereon.

12 Claims, 17 Drawing Figures

Figure 1:
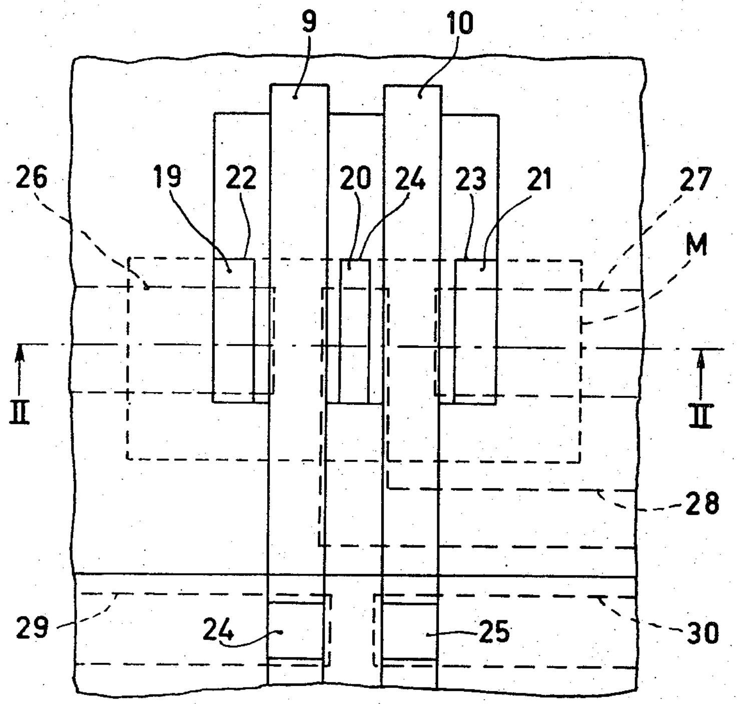

METHOD OF MANUFACTURING A SEMICONDUCTOR DEVICE AND SEMICONDUCTOR DEVICE MANUFACTURED BY USING THE METHOD

The invention relates to a method of manufacturing a semiconductor device in which on a part of a surface of a semiconductor body there is provided a conductive layer which is separated from the said surface part by an insulating layer, after which a doping material is introduced into at least a part of the surface not covered by the conductive layer and the said insulating layer to form at least one surface zone having conductivity properties differing from those of the adjacent semiconductor material, said surface zone being covered with an insulating layer in which a contact window is provided.

The invention furthermore relates to a semiconductor device manufactured by using such a method.

A method as described above is known, for example, from "I.E.E.E. Spectrum," vol. 6, October 1969, pp. 28–35. In this article the manufacture of an insulated gate field effect transistor is described in which an n-type silicon plate is provided with a thick oxide layer which surrounds a non-oxidized surface part. Said surface part is then provided with a thinner oxide layer on which a layer of silicon nitride and a layer of polycrystalline silicon are provided. After forming the gate electrode structure from the thin oxide, the silicon nitride and the polycrystalline silicon by etching, the source and drain zones are formed in the exposed silicon surface by in-diffusing boron while using masking by the gate electrode and the thick oxide layer, after which over the assembly a further oxide layer is provided in which subsequently contact windows for the source and drain zones are provided by masking and etching.

In the described manner a very small overlapping of the source and drain zones with the gate electrode can be achieved since to diffusion mask is necessary for providing the source and drain zones. Due to the absence of said masking step, the described known method is not only very simple technologically, but considerable circuit technical advantages are obtained, notably a very low feedback coupling capacity between the source zone and the gate electrode.

However, an important problem both in the above-described methods and in more conventional methods of manufacturing an insulated gate field effect transistor is formed by the alignment tolerances necessary for providing the source and drain contact windows relative to the gate electrode(s). Said contact windows must be manufactured by means of an accurate mask which has to be aligned with a small tolerance relative to the gate electrode, said tolerance being only a few microns, while in this case it should also be ensured that at the surface the p-n junctions between the source and drain zones and the adjoining semiconductor material do not fall within the contact windows but remain covered with a passivating layer.

Besides in manufacturing an insulated gate field effect transistor, such an alignment problem for providing contact windows may of course also present itself in manufacturing any semiconductor structure in which the position of such a contact window relative to the above-mentioned conductive layer and relative to the boundaries of the said surface zone or zones should be determined with a small tolerance so as to obtain optimum structural and electrical properties.

One of the objects of the invention is to provide a method in which the above-described alignment problems associated with known methods are avoided or are reduced at least considerably.

Another object of the invention is to provide a method with which it is possible to obtain an insulated gate field effect transistor of a very compact structure in which the overlapping between the gate electrode and the source and drain zones and, in the case of a field effect transistor having more than one gate electrode, also between two gate electrodes and the intermediate "island" is reduced to a minimum.

For that purpose the invention is inter alia based on the recognition of the fact that, by chemically converting the conductive layer at its surface into an electrically insulating material during which the material of the semiconductor body is not attacked, a structure can be obtained in which the said contact windows can be provided by using a coarse mask and an alignment step with very wide tolerances, and in certain circumstances even without a masking step.

A method of the type mentioned in the preanble is therefore characterized according to the invention in that a semiconductor body at a surface is covered at least partly with a first electrically insulating layer, that at least a conductive layer which is separated from the semiconductor surface by the first insulating layer is provided on at least a part of said first insulating layer, that said conductive layer is partly converted at its surface into a second electrically insulating layer by a chemical conversion in which the said semiconductor material is substantially not attacked, that, in order to form the said surface zone, the doping material is introduced into at least a part of the semiconductor surface not present below the said second electrically insulating layer and that at least the surface zone is covered with a further insulating layer in which a contact window on said surface zone is formed by etching, which window is at least partly bounded by the first insulating layer, the said first and second insulating layers being removed at most only partly by said etching process.

In the method according to the invention an insulating layer which is provided on the conductive layer and which may be rather thick is present on the conductive layer during provision of the contact window. As a result of this, the desired contact window can be obtained in a simple manner, for example, by etching, by means of a coarse mask without accurate alignment tolerances, the insulating layer present on the conductive layer being maintained at least partly.

A very important preferred embodiment according to the invention is characterized in that a pattern of electrically insulating material which is at least partly inset in the semiconductor body is also provided locally in the said surface by chemical conversion of the semiconductor material, said pattern being removed at most only partly by the said etching process and bounding the contact window at least for a part.

The formed contact window is preferably bounded entirely by the inset insulating pattern and by the second insulating layer. Since the inset insulating pattern is also so thick that it is removed at most only over a part of its thickness by the etching process, the contact window may in this case, for example, if desired be obtained entirely without the use of a mask.

The chemical conversion of the surface of the conductive layer may be effected, for example, by reaction with a medium which, at least at the temperature of said conversion, does substantially not react with the material of the semiconductor body, although in principle the exposed parts of the said first insulating layer might be attacked.

The method according to the invention, however, is advantageously characterized in that the first insulating layer is a masking layer which prevents the underlying semiconductor material from being attacked by the chemical conversion of the conductive layer and that the conductive layer is provided on a part of said masking layer.

If desirable, the inset insulating pattern and the first and second insulating layer may also be used as a mask for doping the said surface zones.

The said chemical conversions for providing the inset pattern and for the superficial conversion of the conductive layer may be mutually different and consist, for example, of the thermal formation, electrolytic formation or formation in a different manner of insulating connections, for example, by reaction with gases or liquids suitable for that purpose. However, in connection with the great technological advantages, at least one and preferably both the said chemical conversions will be formed in most of the cases by an oxidation process.

The doping of the said surface zone or zones may be carried out by diffusion or differently, for example, by means of ion implantation. In particular in this latter case the first insulating layer may remain present on the surface region to be doped provided the energy of the ions to be implanted is sufficiently large to penetrate through said layer. In most of the cases, however, it will be preferable, in particular when the doping takes place by means of diffusion, that prior to the introduction of the doping material at least the parts of the first insulating layer present on the surface to be doped are removed.

An inset oxide pattern can be provided according to known methods (see, for example, "Philips Research Report" vol. 25, April 1970, pp. 118–132), by covering a part of the semiconductor surface with a layer masking against oxidation, after which the uncovered part of the semiconductor surface is subjected, if desired after an etching treatment, to a thermal oxidation treatment to form an inset oxide pattern which encloses a surface part which is covered with the layer masking against oxidation. For example, the conductive layer could be provided immediately on said masking layer (serving as a first insulating layer).

In general, however, when using such an inset pattern it will be preferable that after forming the inset insulating pattern the masking layer used is removed, after which the first insulating layer is provided both on the inset pattern and on the remaining parts of the semiconductor surface. This freshly applied first insulating layer may have a composition differing from the masking layer used for providing the inset pattern, which, for example, in manufacturing an insulated gate field effect transistor presents the important advantage that the first insulating layer which separates the gate electrode from the semiconductor surface can be adapted, as regards composition and thickness, entirely to the desired electrical properties of the transistor to be formed independently of the masking layer chosen for the formation of the inset insulating pattern, which layer, for example, with respect to etchant resistance, dependent on the materials used, may have to fulfil other requirements than the said first insulating layer provided subsequently.

It is noted that the said masking and insulating layers, respectively, need not be homogeneous layers consisting of one material but, if desirable, may be constructed from two or more layers of different materials lying one on top of the other.

In principle, the semiconductor material used may be any semiconductor material which can form a suitable inset pattern, for example, an oxide pattern, for example, silicon, silicon carbide or other elementary semiconductors, or, if desirable, semiconductor compounds. As a conductive layer may also be used in principle, any layer which by chemical conversion, for example by oxidaton, can form a second insulating layer suitable for the above-described method, for example, aluminum or zirconium. In connection inter alia with the associated great technological advantages in the manufacture, however, a very important preferred embodiment according to the invention is characterized in that a semiconductor body of silicon is used, that a layer masking against oxidation is provided, which layer consists at least partly of a layer of silicon nitride, and that a conductive layer of polycrystalline silicon is provided.

The doping material to be introduced serves to vary the conductivity properties of the semiconductor material, for example to increase the conductivity. For example, more strongly doped n-type surface zones can be formed in a thin n-type silicon layer, for example, as source and drain zones of a thin layer "deep-depletion" field effect transistor. However, the doping material may also determine other conductivity properties, for example the life of minority charge carriers by the formation of recombination centres. According to an important preferred embodiment, however, the body comprises a region of a first conductivity type adjoining the surface and a doping material determining the second conductivity type is introduced into said region to form at least one surface zone of the second conductivity type. Said surface zone actually forms a p-n junction with the adjoining region of the first conductivity type which junction, by using the method according to the invention, on the one hand is passivated satisfactorily at the surface and on the other hand shows a minimum p-n junction capacity, which is of importance in particular for devices which are operated at high frequencies. Since as a matter of fact according to the invention the contact window on the said zone is provided in a self-registered manner relative to the conductive layer, the surface area of the zone — and hence of the said p-n junction — can be kept minimum.

The invention is used particularly advantageously to manufacture a semiconductor device having at least one insulated gate field effect transistor in such manner that the conductive layer or layers form the gate electrode(s) of the field effect transistor and that the source and drain zones and an island of the field effect transistor possibly present between two gate electrodes are formed by the surface zones of the second conductivity type.

Prior to the chemical conversion of the surface of the conductive layer, a doping material is often advantageously introduced into the said layer. For example, in manufacturing a field effect transistor having one or more insulated gate electrodes of polycrystalline silicon a donor or acceptor material is introduced into the polycrystalline silicon layer to obtain a sufficiently low gate electrode resistance (of particular importance if the gate electrode material also serves as an interconnection for example, in an integrated circuit). Such a doping is also used often to obtain a desirable value for the threshold voltage. Said doping may be effected by diffusion, by ion implantation or differently and may be carried out both prior to and after etching the desired pattern from the gate electrode material.

A further important preferred embodiment is characterized in that a surface zone of the second conductivity type is diffused into the semiconductor body over such a distance that the line of intersection of its p-n junction with the region of the first conductivity type with the surface substantially coincides with the projection of the edge of the conductive layer at the surface. This may be carried out advantageously by etching away, at the surface and prior to the diffusion, the first insulating layer present on the surface to such an extent that a diffusion window is formed the edge of which has a distance to the conductive layer which corresponds substantially to the lateral diffusion which occurs upon forming the said surface zone. As a result of this, for example, a field effect transistor can be obtained of which, taken parallel to the surface, the gate electrode extends up to the source and/or drain zones but does not substantially overlap these.

The invention furthermore relates to a semiconductor device manufactured by using the described method according to the invention.

Figure 2:
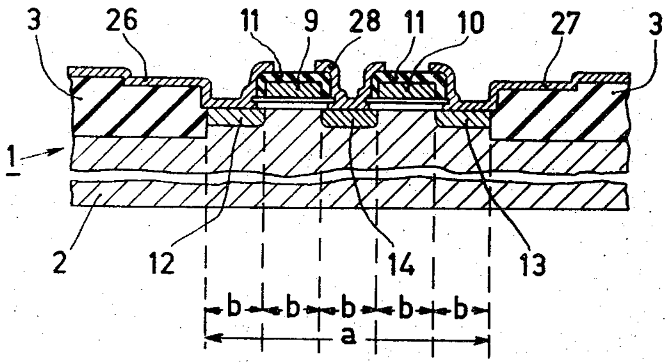
Figure 8:
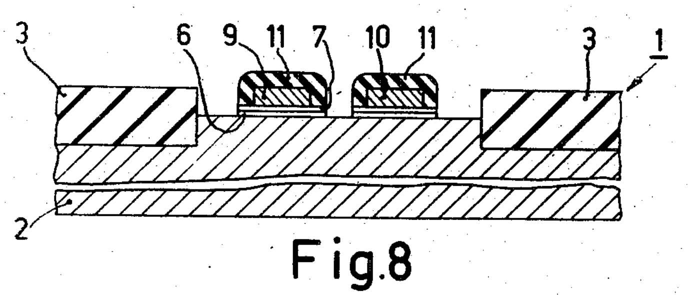
Figure 9:
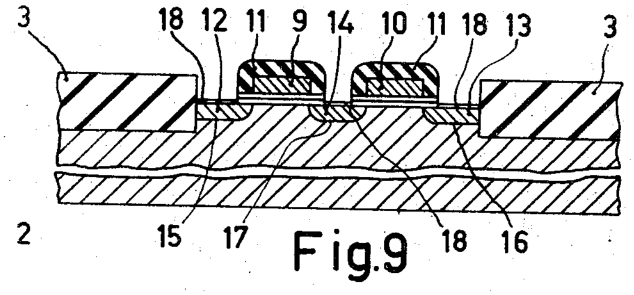
Figure 10:
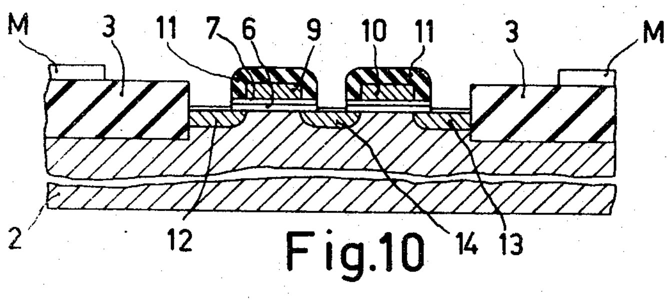
Figure 11:
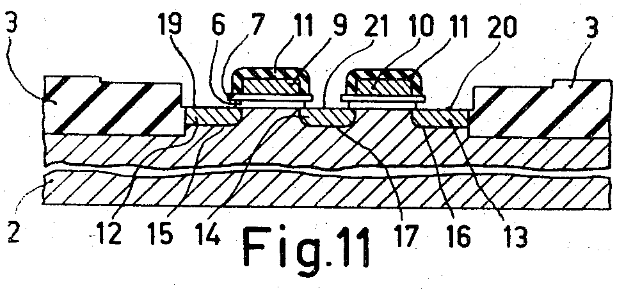
Figure 12:
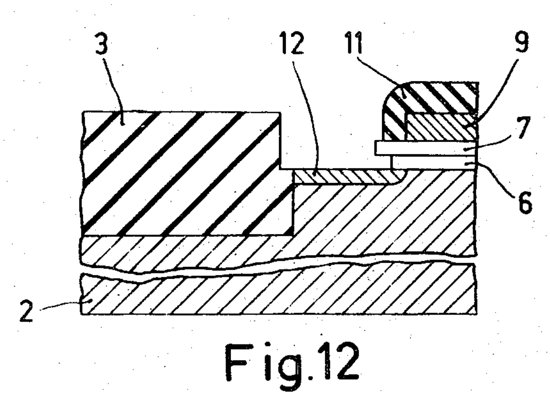
Figure 13:
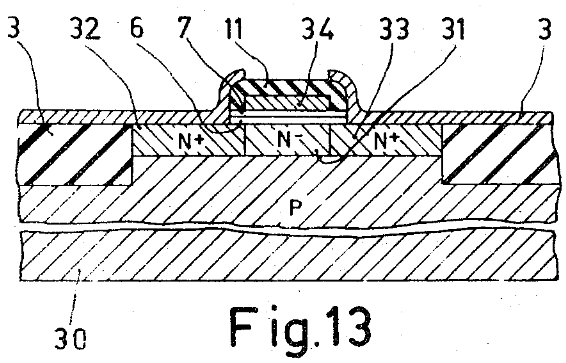

The invention will now be described in greater detail with reference to a few embodiments and the drawing, in which:

FIG. 1 is a diagrammatic plan view of a part of a semiconductor device manufactured by using the method according to the invention, FIG. 2 is a diagrammatic cross-sectional view of the device shown in FIG. 1, taken on the line II—II, FIGS. 3 to 11 are diagrammatic cross-sectional views of the device shown in FIGS. 1 and 2 in successive stages of manufacture, FIG. 12 shows a detail of FIG. 10 when using a certain variation of the method according to the invention, FIG. 13 is a diagrammatic cross-sectional view of another semiconductor device manufactured by using the method according to the invention, and FIGS. 14 to 17 are diagrammatic cross-sectional views of another device according to the invention in successive stages of manufacture.

The FIGURES are diagrammatic and not drawn to scale. Corresponding parts are generally referred to by the same reference numerals. In particular the shape of the inset oxide pattern is shown only diagrammatically.

FIG. 1 is a diagrammatic plan view and FIG. 2 is a diagrammatic cross-sectional view taken on the line II—II of a part of the semiconductor device manufactured by using the method according to the invention. The part of the device shown comprises a field effect transistor having two insulated gate electrodes 9 and 10 of which, in addition to the two gate electrodes, both the source and drain zones (12, 13) and the intermediate island 14 are provided with electric connections. Such tetrode field effect transistors which may be considered as a combination of two transistors having each one gate electrode, are inter alia used frequently in so-called inverter circuits.

According to the invention the device is manufactured as follows, see FIGS. 3 to 11. Starting material (see FIG. 3) is a semiconductor body 1 having a region 2 of, for example, p-type silicon having resistivity of 1 ohm. cm, in which, by using local thermal oxidation with the use of a layer masking locally against oxidation generally used in semiconductor technology, an insulating pattern 3 of silicon oxide which is 2 microns thick and is inset at least partly in the silicon is formed at a surface (the first chemical conversion), which pattern encloses and delimits a surface region 4 of the body. For all the details regarding the provision of such an inset pattern, for the provision of the layers used and masking against oxidation, and for etching thereof reference is made to "Philips Research Report" vol. 25, April 1970, pp. 118–132, in which article all the details important to those skilled in the art are described.

Figure 3:
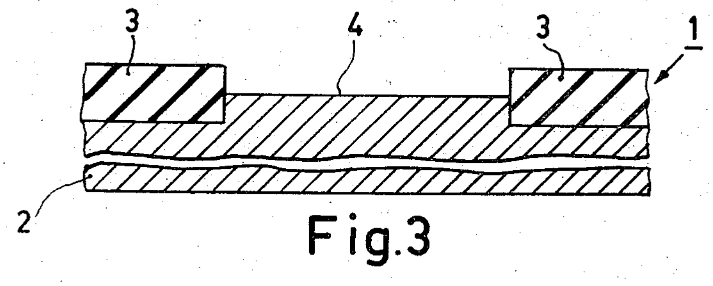

After providing the oxide pattern 3, the layer masking against oxidation and used for that purpose are removed, the structure shown in FIG. 3 being obtained.

A new layer masking against oxidation — the first insulating layer — is then provided throughout the surface. This new masking layer in this embodiment is constructed from a 0.1 micron thick layer 6 of silicon oxide and a 0.1 micron thick layer 7 of silicon nitride present thereon. The layer 6 is provided by thermal oxidation and the layer 7 by deposition from an atmosphere comprising $NH_3$ and $SiH_4$ as described in the last-mentioned publication. In order to avoid complexity of the drawing, the layers 6 and 7 are shown to be equally thick everywhere, although the layer 6 reaches a thickness of 0.1 micron only on the silicon surface 4, whereas the thickness of the already present oxide part 3 does substantially not increase by said further oxidation.

Figure 4:
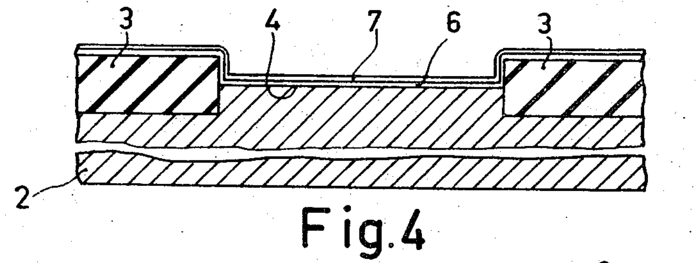
Figure 5:
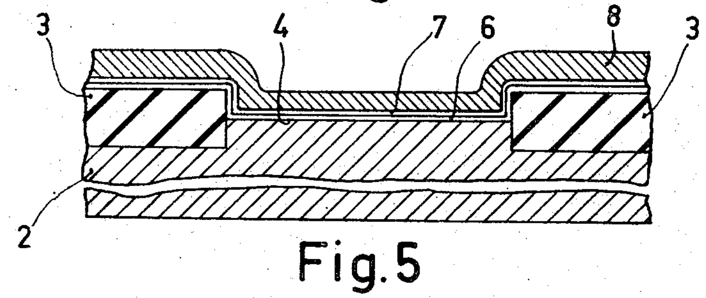

The structure shown in FIG. 4 is obtained in which thus the inset pattern 3 bounds a surface region 4 which is fully covered with a masking layer (6, 7).

A 1 micron thick layer 8 of polycrystalline silicon is then provided on the layer (6, 7) (see FIG. 5) by chemical decomposition of a gaseous silicon compound, which layer 8 is then doped with, for example, phosphorus atoms to a concentration of approximately 10 to 20 atoms/$cm^3$, for example, by diffusion, so as to obtain a sufficiently low resistivity. The methods used in this case also are known per se to those skilled in the art and are described inter alia in the abovementioned article in "I.E.E.E. Spectrum" vol. 6, October 1969, pp. 28–35.

Figures 6, 7:
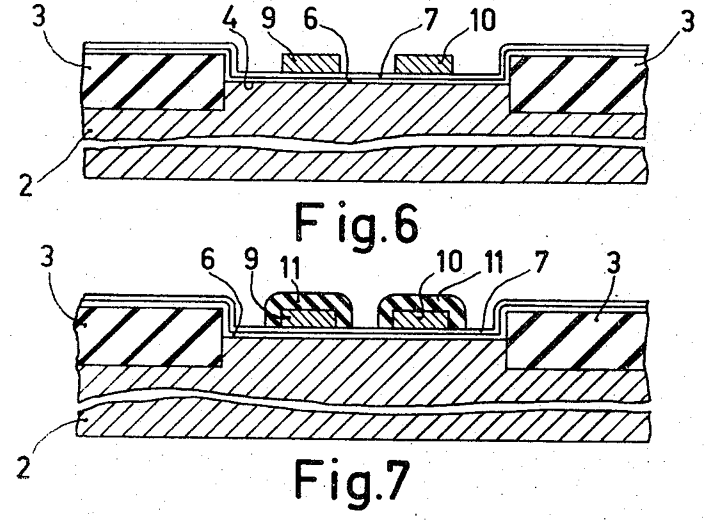

By using a photolithographic etching method which is inter alia generally used in manufacturing monolithic integrated circuits, the gate electrodes 9 and 10 and possible interconnection are then obtained from the layer 8, see FIG. 6.

After providing a conductive layer (9, 10) on a part of the surface region 4 in the above-described manner, according to the invention said layers 9 and 10 are converted at their surface by thermal oxidation, (the second chemical conversion) at approximately 1,000° C for 2 hours in moist oxygen into an oxide layer 11 which is, for example, 1 micron thick (the second insulating layer). The gate electrode layers 9 and 10 grow thinner (approximately 0.5 micron) which is not shown in the Figures for clarity. The remaining parts of the silicon surface remain covered by the masking layer (6, 7) which masks against said thermal oxidation.

In the resulting structure shown in FIG. 7, those parts of the layers 6 and 7 which are not present below the oxidized polycrystalline silicon layer parts, are now removed by etching, the structure shown in FIG. 8 being obtained. Only little of the comparatively thick oxide layers 3 and 11 is removed.

Phosphorus is then indiffused in the uncovered parts of the silicon surface to form the n-type source and drain zones 12 and 13 and the island 14 present between the gate electrodes for such a long period of time that as a result of the lateral diffusion below the edges of the layer (6,7) the formed p-n junctions 15, 16 and 17 between said surface zones and the p-type region 2 intersect the surface 4 according to lines which coincide substantially with the projection of the edge of the gate electrodes 9 and 10 on the surface, so that substantially no overlapping occurs between the zones 12, 13 and 14 and the gate electrodes 9 and 10 (see FIG. 9). The diffusion duration and depth required for this purpose can be determined experimentally by those skilled in the art dependent upon the lateral distance obtained after etching between the edge of the gate electrodes and the edge of the layers 6 present underneath it can be processed in a standard process. During this diffusion a thin layer 18 of phosphor-silicate glass is formed on the silicon surface (see FIG. 9).

Contact windows are then provided on the surface zones 12, 13 and 14. According to the invention this is carried out in a very simple manner by providing a photoresist mask having an aperture which may be much wider than the contact windows to be formed and the circumference of which is denoted diagrammatically by M in FIGS. 1 and 10. This may be done with a coarse mask without narrow alignment tolerances. When the glass layer 18 is removed from the whole surface of the zones 12, 13 and 14, said photoresist mask may even be omitted entirely provided no silicon parts can be exposed by the subsequent etching process in other places where this would be undesirable. In the present example, the layer 18 is removed by etching over only a part of the zone 12, 13 and 14 (see FIG. 1), the contact windows 19, 20 and 21 being formed which are bounded partly by the pattern 3 and the layer (6, 7). The mask M determines the boundary parts 22, 23 and 24 of the contact windows (FIG. 1).

During this etching process, the oxide layers 3 and 11 which are comparatively thick, are removed only over a small part of their thickness. During this short etching treatment a small part of the thin oxide layer 6 is also removed, the edge of the p-n junctions 15, 16 and 17, however, remaining covered by the layer 6.

By means of a further mask, which likewise is not critical, contact windows 24 and 25 are then provided in the thick oxide layer 11, after which aluminum layers 26 and 27 for contacting the source and drain zones 12 and 13, aluminum layer 28 for contacting the island 14, and aluminum layers 24 and 25 for contacting the gate electrodes 9 and 10 are provided by using conventionally used vapour deposition methods and photolithographic etching methods, the structure shown in FIGS. 1 and 2 being obtained.

As a result of the method used, the resulting structure is very compact and substantially no overlapping exists between the gate electrodes 9 and 10 and the zones 12, 13 and 14, which minimizes undesirable capacitances between said zones and the gate electrodes. For example, the dimension $a$ in the resulting structure (see FIG. 2) is equal to 30 microns, while the distance $b$ which in this example are mutually equal are 6 microns each. When using known methods, at least another 4 times the alignment tolerance and the mask inaccuracy for making the contact windows would have to be added.

In the method as described above many variations may be used. For example, after obtaining the structure shown in FIG. 7 and prior to partially removing the layers 6 and 7, the surface may be subjected to an ion bombardment instead of (or in combination with) a diffusion, in which ions of a doping material determining the conductivity type of the surface zones 12, 13 and 14 are implanted into the region 2 through the layers 6 and 7 while using the pattern 3 and the layers 11 as masks, after which, to form the contact windows, the layers 6 and 7 are removed by etching of at least a part of the zones 12, 13 and 14 while masking by inter alia the pattern 3 and the layers 11 (FIG. 8). When using said ion implantation, however, the layer (6,7) may also be removed there prior to implantation.

In the example described, a new masking layer (6,7) has been provided after obtaining the structure shown in FIG. 3. In certain circumstances, however, the masking layer present on the surface regions 4 already during providing the inset pattern 3 could be used instead of this, at least if said layer as a dielectric between the gate electrode and the semiconductor surface has the desired electrical properties.

Furthermore, the semiconductor material may consist of a material other than silicon, while the pattern 3 need not necessarily be an oxide, but may also be, for example, a nitride or another insulating chemical compound of the said semiconductor material which is obtained from the semiconductor material by a chemical reaction with a material suitable for that purpose and at a temperature suitable for that purpose. The conductive layer 8 from which in this example gate electrodes 9 and 10 are formed may also be formed from another conductive material, for example aluminum or zirconium, instead of from polycrystalline silicon, the insulating layer 11 being formed by superficial oxidation and consisting of aluminum oxide or zirconium oxide. Insulating compounds other than oxides may also be considered for the layer 11. Furthermore it is not necessary for the layer 8 to be provided first throughout the surface since in some cases the conductive layer can be provided directly in the desirable pattern, for example by vapour-deposition via a mask.

Furthermore, in manufacturing the above-described field effect transistor, the polycrystalline silicon of one or of both gate electrodes may be doped instead of with a donor with an acceptor so as to obtain desirable electrical effects with respect to, for example, the threshold voltage, that is to say the gate electrode voltage at which the channel part of the field effect transistor below the gate electrode in question starts conducting.

When source and drain zones and possibly islands are desirable having a considerably smaller thickness than the insulating layer 11, and nevertheless substantially no overlapping may occur between said zones and the gate electrode(s), etching so as to obtain the structure shown in FIG. 8 may be continued until a part of the oxide layer 6 below the layer 11 is removed to such an extent that the shallow diffusion to form the said zones by lateral diffusion below the layer 6 nevertheless falls accurately below the edge of the gate electrodes (see detailed drawing in FIG. 12).

The method according to the invention may be used for the manufacture of field effect transistors having a quite different geometry, with one or more insulating gate electrodes, in which, for example, the source zone surrounds the drain zone entirely.

The region 2 may be formed by an epitaxial layer which is provided, for example, on a substrate of the opposite conductivity type. See FIG. 13 which is a diagrammatic cross-sectional view of a deep-depletion field effect transistor having an insulated gate electrode 34 and highly doped source and drain zones 32, 33 which are provided in an epitaxial layer 31 of the same conductivity type which is present on a substrate 30 of the opposite conductivity type. Both the source and drain zones 32 and 33 and the inset pattern 3 may be provided throughout the thickness (possibly down into the substrate 30) or over only a part of the thickness of the layer 31. As is known, the upper side of the inset insulating pattern may, if desirable, also coincide substantially with the semiconductor surface (see FIG. 13) by etching away, prior to the local oxidation, a part of the semiconductor material present at the area of the pattern to be provided.

Of very great importance is the method according to the invention in the manufacture of structures in which in a semiconductor body an insulated gate field effect transistor is provided within a region (pocket or well) bounded by an inset insulating pattern and of a conductivity type which forms a p-n junction with the adjacent part of the body. Such structures are advantageously used for the formation of both n-channel and p-channel field effect transistors in one monolithic integrated circuit.

Figure 14:
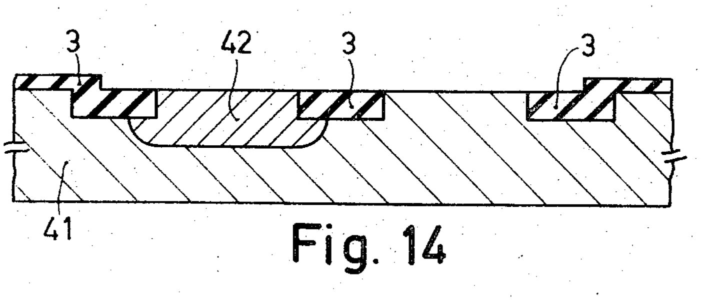
Figure 15:
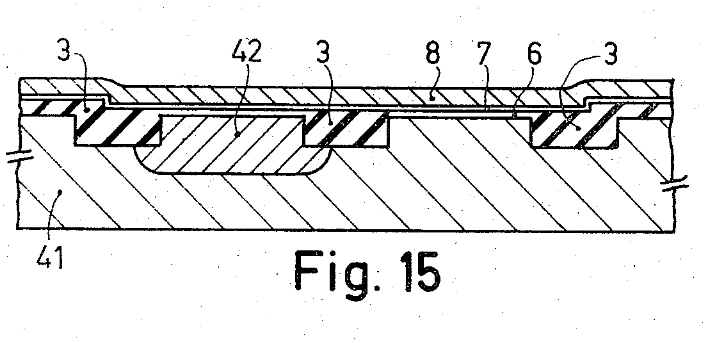
Figure 16:
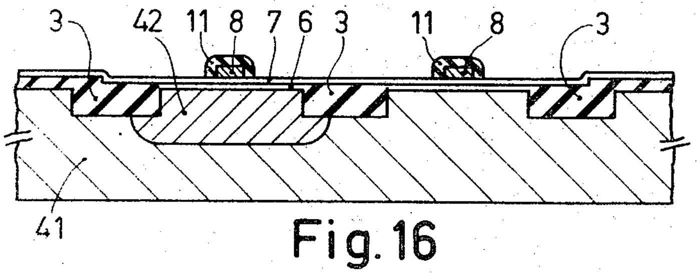
Figure 17:
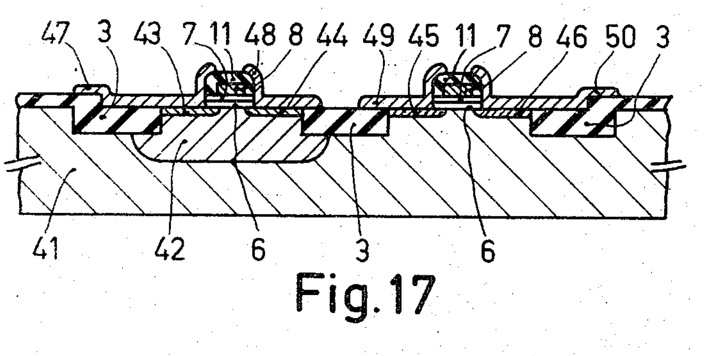

FIGS. 14 and 17 show an example of such a structure. Starting material is an n-type substrate 41 in which, by local oxidation as described in the preceding examples, an inset oxide pattern 3 is provided after which by local masking boron is introduced to form the p-type region ("pocket") 42, for example by diffusion or by ion implantation (see FIG. 14). A thin gate oxide layer 6, a thin layer 7 of silicon nitride and a layer 8 of polycrystalline silicon are then provided successively over the entire surface according to conventional methods described in the preceding examples. See FIG. 15. The polycrystalline silicon 8 is then etched in the desired pattern to form gate electrodes and possible interconnections and is then doped, for example, by means of diffusion or differently, with donors or acceptors. This doping may also be carried out prior to etching the layer 8 in the desired pattern. The resulting parts of the layer 8 are then partly converted by oxidation into an oxide layer 11, the structure shown in FIG. 16 being obtained.

The nitride 17 is then etched away as well as the oxide 6 at those areas where the next dopings have to be carried out. For example, the oxide 6 may first be removed only above the n-channel field effect transistor to be formed, after which diffusion (or implantation) of the n-type zones 43 and 44 is carried out while subsequently the oxide 6 is removed above the p-channel transistor, the p-type source and drain zones 45 and 46 being then provided, for example, by a boron diffusion of such a concentration that the zones 43 and 44 are not overdoped. In certain circumstances, said sequence may also be reversed while an extra masking layer may also be used to mask alternately the region of the n-channel and the p-channel transistor against doping. The masks used may have a large tolerance. The transistors are then contacted by means of the metal layers 47, 48, 49 and 50.

An important advantage is obtained in the above-described case in that of both transistors all the contact holes for the source and drain zone have been determined in a self-registering manner by the inset oxide 3 and the oxide layer 11. An extra mask is required only for contacting the gate electrodes 8 through the thick oxide layer 11, unless the oxidation of the layer 8 is locally prevented (for example by a nitride layer) in which case the source and drain contact holes and the gate contact holes can be formed in one etching step in a self-registered manner. The surface area of the source and drain zones can be kept very small in this extremely compact structure and hence also, for example, the capacity of the drain zone, while the Miller capacitances between the drain zone and the gate electrode are very small due to the minimum overlap, as already described above.

Finally it is to be noted that semiconductor structures other than insulated gate field effect transistors which satisfy the description given in the preamble can also be manufactured advantageously by using the method according to the invention and that in the examples described in certain circumstances not all but only a part of the contact windows to be provided can be realized by using the method according to the invention, whereas the remaining contact windows are obtained in another manner.

It is obvious that, in addition to the semiconductor circuit elements mentioned in the examples, other elements, for example, bipolar transistors can be formed on the semiconductor disc, simultaneously or not simultaneously. These elements may be electrically interconnected with the parts shown in the Figures, for example, via metal layers or layers of doped polycrystalline silicon. It will also be obvious that the conductivity types used in any example may all (collectively) be replaced by their opposite conductivity types.

What is claimed is:

1. A method of manufacturing a semiconductor device comprising the steps of providing on a surface of a semiconductor body a first electrically insulating layer, providing on said body so as to extend over only part of said semiconductor surface at least one electrically conductive layer separated from the semiconductor surface by said first insulating layer, converting the exposed surface of said conductive layer into a second electrically insulating layer by a chemical conversion process, said first insulating layer masking the underlying semiconductor surface against said chemical conversion process, thereafter introducing into said semiconductor surface doping material against which said conductive layer and said second insulating layer acts as a mask to form at least one surface zone in the body having conductivity properties different from those of the adjacent semiconductor material, and forming by an etching process a contact window over said surface zone, said second insulating layer forming part of the contact window etching mask and being removed at most only partly by said etching process.

2. A method as claimed in claim 1 wherein a pattern of electrically insulating material which is at least partly inset in the semiconductor body is also provided locally in the said surface by chemical conversion of the semiconductor material, said pattern being removed at most only partly by the said etching process and bounding the contact window at least for a part.

3. A method as claimed in claim 2 wherein by the etching process a contact window is formed which is bonded entirely by the inset insulating pattern and by the portion of the first insulating layer between the conductive layer and the semiconductor surface.

4. A method as claimed in claim 1 wherein said chemical conversion process is an oxidation process.

5. A method as claimed in claim 1 wherein prior to introducing the doping material at least the parts of the first insulating layer present on the surface portion to be doped are removed.

6. A method as claimed in claim 2 wherein after forming the inset insulating pattern, the first insulating layer is provided both on the inset pattern and on the remaining parts of the semiconductor surface.

7. A method as claimed in claim 4 wherein the semiconductor body is of silicon on which is provided a layer masking against oxidation which comprises silicon nitride, and a conductive layer polycrystalline silicon is provided over the oxidation masking layer.

8. A method as claimed in claim 1 wherein the surface zone formed is of a second conductivity type opposite to that of the adjacent material which is of a first type.

9. A method as claimed in claim 8 for the manufacture of a semiconductor device having at least one insulated gate field effect transistor, wherein the conductive layer constitutes the gate electrode of the field effect transistor and the source and drain zones of the field effect transistor are formed by two of said surface zones.

10. A method as claimed in claim 1 wherein prior to the chemical conversion of the conductive layer surface, a doping material is introduced into said conductive layer.

11. A method as claimed in claim 8 wherein a surface zone of the second conductivity type is diffused into the semiconductor body over such a distance that the line of intersection of its P-N junction with the adjacent material of the first conductivity type with the surface substantially coincides with the projection of the edge of the conductive layer at the surface.

12. A method as claimed in claim 9 wherein the said field effect transistor is provided in a region of the first conductivity type bounded by an inset insulating pattern, which first type region forms a P-N junction with an adjoining part of the body of the second conductivity type and that in said adjoining part a second field effect transistor having a structure complementary to the first transistor is formed in a similar manner in which the contact windows for the source and drain zones of both transistors are all bounded by the inset insulating pattern and the first insulating layer and are provided during the same etching step.

* * * * *